United States Patent
Nottelmann et al.

(10) Patent No.: US 10,957,612 B2
(45) Date of Patent: Mar. 23, 2021

(54) POWER SEMICONDUCTOR MODULE ARRANGEMENT AND HOUSING FOR A POWER SEMICONDUCTOR ARRANGEMENT

(71) Applicant: Infineon Technologies AG, Neubiberg (DE)

(72) Inventors: Regina Nottelmann, Bad Sassendorf (DE); Mark Schnietz, Lippstadt (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/574,689

(22) Filed: Sep. 18, 2019

(65) Prior Publication Data
US 2020/0091023 A1 Mar. 19, 2020

(30) Foreign Application Priority Data
Sep. 19, 2018 (EP) .................... 18195322

(51) Int. Cl.
*H01L 23/055* (2006.01)
*H01L 23/495* (2006.01)
*H01R 12/58* (2011.01)

(52) U.S. Cl.
CPC ...... *H01L 23/055* (2013.01); *H01L 23/49534* (2013.01); *H01R 12/585* (2013.01)

(58) Field of Classification Search
CPC ............ H01L 23/055; H01L 23/49534; H01R 12/585
See application file for complete search history.

(56) References Cited

U.S. PATENT DOCUMENTS

| | | | | |
|---|---|---|---|---|
| 4,433,886 A * | 2/1984 | Cassarly | ............... | H01L 23/552 257/E23.114 |
| 5,759,104 A * | 6/1998 | Shirae | .................. | H05K 5/0256 439/361 |
| 6,078,102 A * | 6/2000 | Crane, Jr. | ............. | H01L 23/053 257/693 |
| 6,129,584 A * | 10/2000 | Chiba | .................. | H01R 43/205 439/573 |
| 6,577,003 B1 * | 6/2003 | Crane, Jr. | ............. | H01R 12/73 257/738 |

(Continued)

*Primary Examiner* — Michele Fan
(74) *Attorney, Agent, or Firm* — Murphy, Bilak & Homiller, PLLC

(57) ABSTRACT

A power semiconductor module arrangement includes a substrate including a dielectric insulation layer, a first metallization layer arranged on a first side of the dielectric insulation layer, and a second metallization layer arranged on a second side of the dielectric insulation layer, the dielectric insulation layer being disposed between the first and second metallization layers. The arrangement further includes at least one first connection element mounted on the substrate, a housing having sidewalls, and at least one second connection element. Each second connection element includes a first part extending vertically through a sidewall of the housing, a second part coupled to a first end of the first part and protruding from the sidewall in a vertical direction, and a third part coupled to a second end of the first part opposite the first end. Each third part is detachably coupled to one of the at least one first connection element.

20 Claims, 6 Drawing Sheets

(56) References Cited

U.S. PATENT DOCUMENTS

| | | | |
|---|---|---|---|
| 6,687,135 B1* | 2/2004 | Kitade | H05K 3/3405 174/365 |
| 6,967,849 B1 | 11/2005 | Hwang et al. | |
| 7,048,450 B2* | 5/2006 | Beer | G02B 6/4292 385/88 |
| 9,543,703 B2* | 1/2017 | Horchler | H01R 13/05 |
| 2002/0117751 A1* | 8/2002 | Crane, Jr. | H05K 7/1061 257/734 |
| 2003/0235038 A1* | 12/2003 | Goebl | H01L 25/072 361/719 |
| 2005/0260867 A1* | 11/2005 | Ono | H05K 1/144 439/65 |
| 2006/0007721 A1* | 1/2006 | Rodriguez | H02M 7/003 363/146 |
| 2009/0009979 A1* | 1/2009 | Mori | H05K 1/144 361/784 |
| 2009/0021916 A1* | 1/2009 | Stolze | H01L 23/053 361/709 |
| 2010/0091464 A1 | 4/2010 | Ohnishi et al. | |
| 2010/0144201 A1* | 6/2010 | Defibaugh | H01R 13/514 439/607.05 |
| 2010/0165582 A1 | 7/2010 | Hornkamp | |
| 2012/0214356 A1* | 8/2012 | Hasegawa | H01R 13/2421 439/817 |
| 2012/0244648 A1* | 9/2012 | Matsuhashi | G01R 1/0466 438/15 |
| 2012/0306091 A1 | 12/2012 | Stolze et al. | |
| 2013/0082387 A1 | 4/2013 | Stolze et al. | |
| 2013/0141922 A1* | 6/2013 | Wakamiya | F21K 9/20 362/373 |
| 2014/0102626 A1* | 4/2014 | Clayton | H05K 3/40 156/196 |
| 2014/0179173 A1* | 6/2014 | Suzuki | H01R 12/585 439/751 |
| 2014/0198454 A1* | 7/2014 | Yuan | H01L 25/165 361/720 |
| 2015/0300574 A1* | 10/2015 | Preuschl | H01R 12/714 362/382 |
| 2016/0276772 A1* | 9/2016 | Chew | H01R 43/26 |
| 2017/0040732 A1* | 2/2017 | Farole | H01R 13/422 |
| 2017/0170084 A1* | 6/2017 | Yao | H01L 23/08 |
| 2019/0057923 A1* | 2/2019 | Otremba | H01L 23/40 |
| 2019/0379325 A1* | 12/2019 | Kondo | H03H 9/02102 |

* cited by examiner

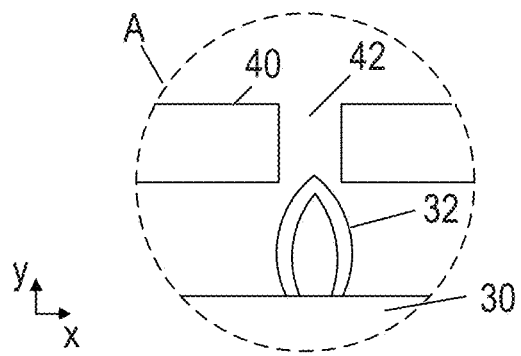
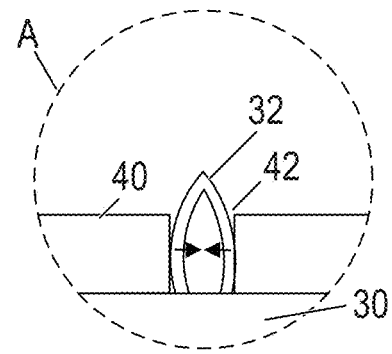
FIG 3A  FIG 3B
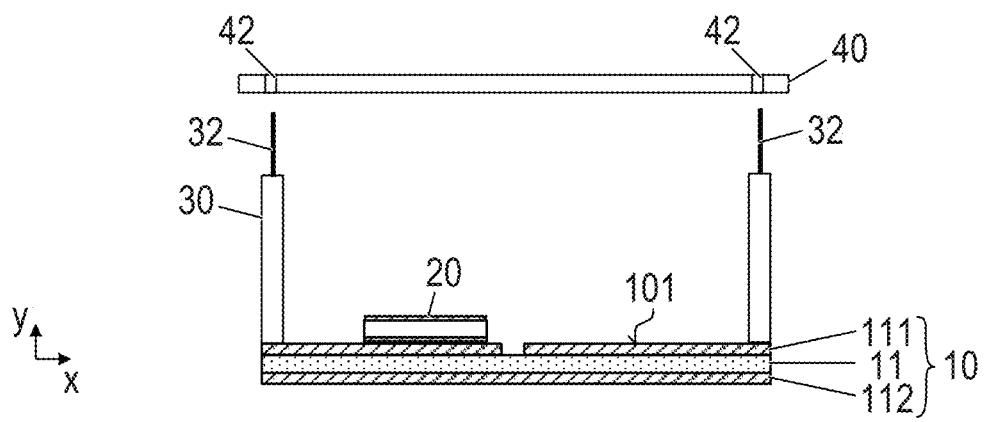
FIG 4

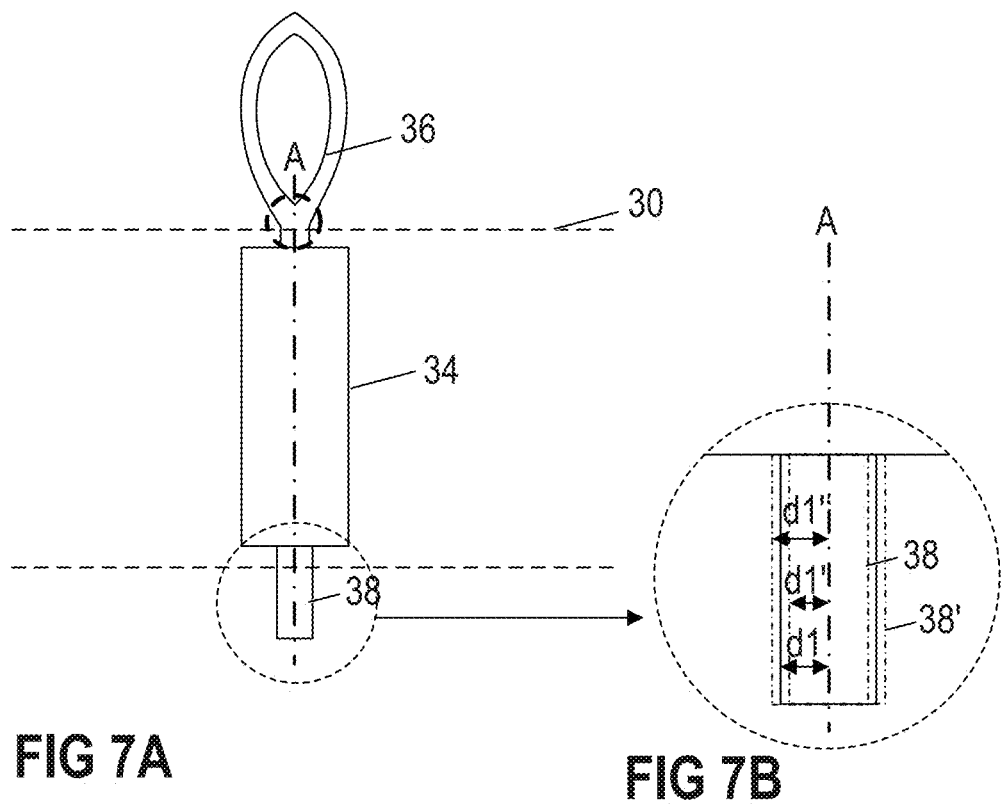
FIG 7A
FIG 7B
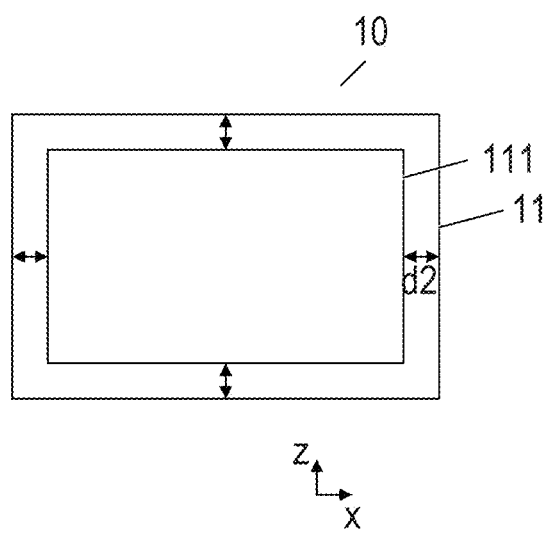
FIG 8
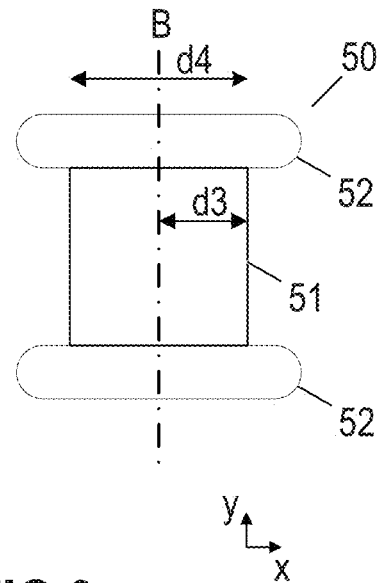
FIG 9

POWER SEMICONDUCTOR MODULE ARRANGEMENT AND HOUSING FOR A POWER SEMICONDUCTOR ARRANGEMENT

TECHNICAL FIELD

The instant disclosure relates to a power semiconductor module arrangement and a housing for a power semiconductor module arrangement.

BACKGROUND

Power semiconductor module arrangements often include a substrate within a housing. The substrate usually comprises a substrate layer (e.g., a ceramic layer), a first metallization layer deposited on a first side of the substrate layer and a second metallization layer deposited on a second side of the substrate layer. A semiconductor arrangement including one or more controllable semiconductor elements (e.g., two IGBTs in a half-bridge configuration) may be arranged on the substrate. One or more contact elements, which allow for contacting such a semiconductor arrangement from outside the housing, are usually provided. Power semiconductor modules are known in which the contact elements are arranged on the substrate and protrude in a direction that is essentially perpendicular to the main surface of the substrate through a cover of the housing. The section of the contact elements which protrudes out of the housing may be mechanically and electrically coupled to a printed circuit board. Usually, the printed circuit board comprises through holes and the contact elements are inserted through the respective through holes. Such arrangements usually require an extensive developmental effort and a large number of manufacturing steps. Therefore, the costs for such arrangements are comparably high.

There is a need for a power semiconductor module arrangement that requires reduced developmental effort and a reduced number of manufacturing steps and is therefore more cost-effective than conventional power semiconductor module arrangements.

SUMMARY

A power semiconductor module arrangement includes a substrate comprising a dielectric insulation layer, a first metallization layer arranged on a first side of the dielectric insulation layer, and a second metallization layer arranged on a second side of the dielectric insulation layer, wherein the dielectric insulation layer is disposed between the first and the second metallization layer. The arrangement further includes at least one first connection element mounted on the substrate, a housing including sidewalls, and at least one second connection element. Each second connection element includes a first part extending vertically through a sidewall of the housing, a second part coupled to a first end of the first part and protruding from the sidewall in a vertical direction, and a third part coupled to a second end of the first part opposite the first end. Each third part is detachably coupled to one of the at least one first connection element.

A housing for a power semiconductor module arrangement includes sidewalls and at least one second connection element. Each second connection element includes a first part extending vertically through a sidewall of the housing, a second part coupled to a first end of the first part and protruding from the sidewall in a vertical direction, and a third part coupled to a second end of the first part opposite the first end. The housing is configured to be detachably mounted on a substrate by detachably coupling each of the third parts to a first connection element mounted on the substrate, wherein the substrate includes a dielectric insulation layer, a first metallization layer arranged on a first side of the dielectric insulation layer, a second metallization layer arranged on a second side of the dielectric insulation layer, wherein the dielectric insulation layer is disposed between the first and the second metallization layer.

The invention may be better understood with reference to the following drawings and the description. The components in the figures are not necessarily to scale, emphasis instead being placed upon illustrating the principles of the invention. Moreover, in the figures, like referenced numerals designate corresponding parts throughout the different views.

BRIEF DESCRIPTION OF THE DRAWINGS

FIGS. 3A and 3B schematically illustrate a pressfit connection.

FIG. 4 is a cross-sectional view of an example of a power semiconductor module arrangement.

FIGS. 7A and 7B schematically illustrate an exemplary connection element in greater detail.

FIG. 8 schematically illustrates a top view of a semiconductor substrate.

FIG. 9 schematically illustrates a cross-sectional view of a connection element including a sleeve.

DETAILED DESCRIPTION

In the following detailed description, reference is made to the accompanying drawings. The drawings show specific examples in which the invention may be practiced. It is to be understood that the features and principles described with respect to the various examples may be combined with each other, unless specifically noted otherwise. In the description, as well as in the claims, designations of certain elements as "first element", "second element", "third element" etc. are not to be understood as enumerative. Instead, such designations serve solely to address different "elements". That is, e.g., the existence of a "third element" does not require the existence of a "first element" and a "second element". A semiconductor body as described herein may be made from (doped) semiconductor material and may be a semiconductor chip or may be included in a semiconductor chip. A semiconductor body has electrically connecting pads and includes at least one semiconductor element with electrodes.

Figure 1:
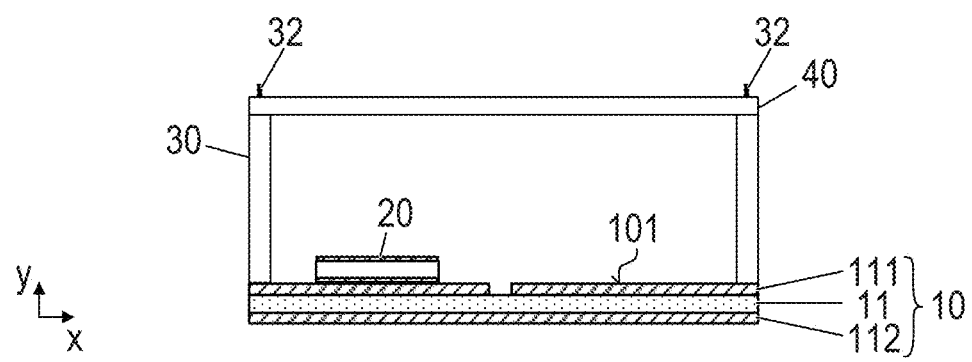
FIG. 1 is a cross-sectional view of a power semiconductor module arrangement.

Referring to FIG. 1, a conventional power semiconductor module arrangement is illustrated. The power semiconductor module arrangement includes a substrate 10. The substrate 10 includes a dielectric insulation layer 11, a (structured) first metallization layer 111 arranged on a first side of the dielectric insulation layer 11, and a second metallization layer 112 arranged on a second side of the dielectric insulation layer 11. The dielectric insulation layer 11 is disposed between the first and the second metallization layer 111, 112. The substrate 10, however, may also include multiple dielectric insulation layers and metallization layers stacked alternatingly on each other, with buried metallization layers acting either as shielding layers or being part of the electronic circuit and electrically connected to other metallization layers by means of through contacts. A buried metallization layer in this context is a metallization layer that is arranged between two dielectric insulation layers.

Again referring to FIG. 1, each of the first and second metallization layers 111, 112 may consist of or include one of the following materials: copper; a copper alloy; aluminum; an aluminum alloy; any other metal or alloy that remains solid during the operation of the power semiconductor module arrangement. The substrate 10 may be a ceramic substrate, that is, a substrate in which the dielectric insulation layer 11 is a ceramic, e.g., a thin ceramic layer. The ceramic may consist of or include one of the following materials: aluminum oxide; aluminum nitride; zirconium oxide; silicon nitride; boron nitride; or any other dielectric ceramic. The substrate 10 may be, e.g., a Direct Copper Bonding (DCB) substrate, a Direct Aluminum Bonding (DAB) substrate, or an Active Metal Brazing (AMB) substrate. Further, the substrate 10 may be an Insulated Metal Substrate (IMS). An Insulated Metal Substrate generally comprises a dielectric insulation layer 11 comprising (filled) materials such as epoxy resin or polyimide, for example. The material of the dielectric insulation layer 11 may be filled with ceramic particles, for example. Such particles may comprise, e.g., $Si_2O$, $Al_2O_3$, $AlN$, or $BrN$ and may have a diameter of between about 1 µm and about 50 µm. The first metallization layer 111 of an IMS may be a comparably thin copper layer (e.g., thickness of between 35 µm and 140 µm), and the second metallization layer 112 may be a comparably thick aluminum or copper layer (e.g., thickness of between 0.6 mm and 2.0 mm), for example. The substrate 10, however, may also be a conventional printed circuit board (PCB) having a non-ceramic dielectric insulation layer 11. For instance, a non-ceramic dielectric insulation layer 11 may consist of or include a cured resin.

One or more semiconductor bodies 20 may be arranged on the substrate 10. In particular, the one or more semiconductor bodies 20 may be arranged on a first surface of the first metallization layer 111 which faces away from the dielectric insulation layer 11. Each of the semiconductor bodies 20 arranged on the semiconductor substrate 10 may include a diode, an IGBT (Insulated-Gate Bipolar Transistor), a MOSFET (Metal-Oxide-Semiconductor Field-Effect Transistor), a JFET (Junction Field-Effect Transistor), a HEMT (High-Electron-Mobility Transistor), or any other suitable controllable semiconductor element.

The one or more semiconductor bodies 20 may form a semiconductor arrangement on the substrate 10. In FIG. 1, only one semiconductor body 20 is exemplarily illustrated. The one or more semiconductor bodies 20 may be electrically and mechanically connected to the main substrate 10 by an electrically conductive connection layer (not illustrated). Such an electrically conductive connection layer may be a solder layer, a layer of an electrically conductive adhesive, or a layer of a sintered metal powder (e.g., a sintered silver powder), for example. According to another example, the connection may be a welded connection.

The second metallization layer 112 of the semiconductor substrate 10 in FIG. 1 is a continuous layer. The first metallization layer 111 is a structured layer in the example illustrated in FIG. 1. "Structured layer" in this context means that the first metallization layer 111 is not a continuous layer, but includes recesses between different sections of the layer. Such a recess is schematically illustrated in FIG. 1. The first metallization layer 111 in this example includes two different sections. Any other number of recesses and sections, however, is also possible. Different semiconductor bodies 20 may be mounted to the same or to different sections of the first metallization layer 111. There may also be sections of the first metallization layer 111 with no semiconductor bodies 20 mounted thereon. Different sections of the first metallization layer 111 may have no electrical connection or may be electrically connected to one or more other sections. In other examples, the first metallization layer 111 may also be a continuous layer.

The power semiconductor arrangement may further comprise a housing. In the example illustrated in FIG. 1, the housing comprises sidewalls 30. A lid 40 may be mounted to the sidewalls 30 to close the housing. The substrate 10 in the Example of FIG. 1 forms a bottom of the housing.

Figure 2:
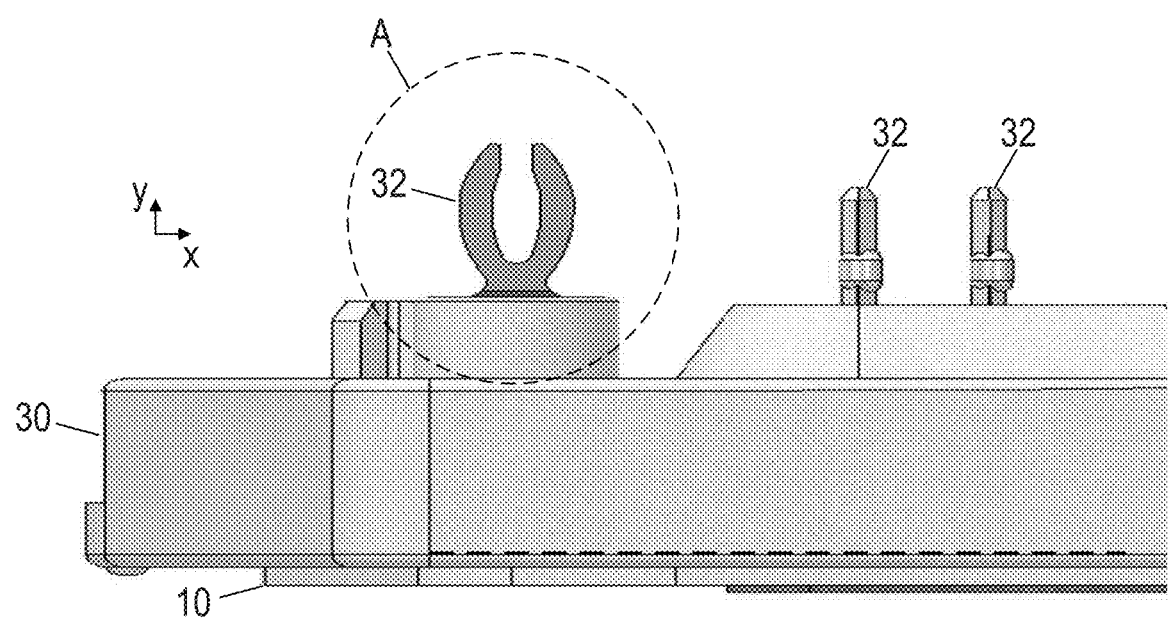
FIG. 2 schematically illustrates a semiconductor substrate in a housing with connection elements.

The semiconductor arrangement further comprises connection elements 32 that are configured to provide electrical connections between the inside and the outside of the housing. In FIG. 1, such connection elements 32 are merely indicated by pins protruding from the lid 40. Further, exemplary connection elements 32 are schematically illustrated in FIG. 2, which schematically illustrates a section of a power semiconductor module arrangement with a substrate 10 and sidewalls 30. The connection elements 32 protrude from the sidewalls 30 in a vertical direction y of the power semiconductor module arrangement. In FIG. 2, two different types of connection elements 32 are exemplarily illustrated. Some of the connection elements 32 in FIG. 2 are simple pins or wires (pins on the right side of FIG. 2). The connection elements 32, however, may also comprise pressfit pins (pin on the left side of FIG. 2). It is possible to use different kinds of connection elements 32 within one power semiconductor module arrangement, or to use only one kind of connection elements 32. The function of pressfit pins is described in further detail with reference to FIGS. 3A-3B below.

FIG. 3A schematically illustrates a pressfit pin (connection element 32) and a corresponding counterpart (through hole 42) in a non-assembled state, and FIG. 3B schematically illustrates the pressfit pin and the corresponding counterpart 42 in an assembled state. While not connected to the counterpart 42, a pressfit pin has a larger maximum width than its counterpart 42. The maximum width of the pressfit pin in the exemplary power semiconductor module arrangement is a width in a horizontal direction x parallel to the top surface 101 of the semiconductor substrate 10. During the press-in process, the pressfit pin is pushed into the counterpart 42. This results in a plastic deformation of the pressfit pin. When inserted into the counterpart 42, the maximum width of the pressfit pin is reduced, as is schematically illustrated by means of arrows in FIG. 3B. Only a small insertion force, accompanied by a high holding force, is generally needed to insert the pin. The pressfit pin and its counterpart 42 are firmly attached to each other after insertion of the pin. The reduced width of the pressfit pin results in a force which counteracts the compression of the pressfit pin. The connection elements 32, therefore, may not be easily detached from the through holes 42. The through holes 42, e.g., may be through holes 42 of a lid 40 or of a circuit board (not illustrated) that is to be electrically connected to the semiconductor arrangement on the substrate 10.

As has already been outlined above, the use of pressfit pins is only an example. It is also possible that the connection elements 32 comprise wires or simple pins that are, e.g., soldered, into a respective through hole 42. Any other suitable connections are also possible.

Figure 5:
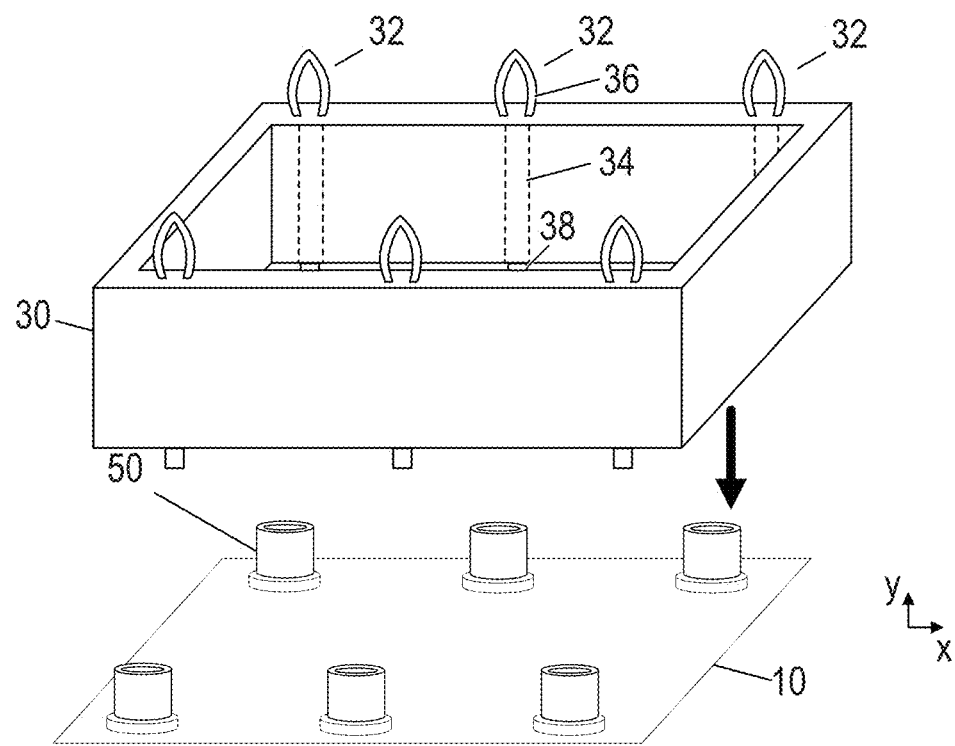
FIG. 5 is an exploded view of an example of a power semiconductor module arrangement.

FIG. 4 schematically illustrates the arrangement of FIG. 1 in an unassembled state in which the lid 40 is not yet mounted to the sidewalls 30. The exploded view shown in FIG. 5 illustrates the power semiconductor arrangement in a state in which the sidewalls 30 are not yet mounted to the substrate 10. For the sake of simplicity, the substrate 10 in FIG. 5 is illustrated as a single layer. The metallization layers 111, 112 are not explicitly shown in FIG. 5. As can be seen in the example of FIG. 5, several first connection elements 50 are mounted on the substrate 10. The second connection elements 32, in the assembled state, are configured to form a detachable electrical and mechanical connection with the first connection elements 50. The second connection elements 32 partly extend through the sidewalls 30 of the housing. The second connection elements 32 may be molded into the sidewalls, for example. According to another example, the second connection elements 32 are inserted into respective voids or cavities in the sidewalls 30 from a bottom side of the sidewalls 30.

In the example of FIG. 5, second connection elements 32 are arranged in two of the sidewalls 30 of the housing. That is, the power semiconductor module arrangement comprises a plurality n of second connection elements 32, with n≥2. A first subset of the plurality n of second connection elements 32 is arranged in (extends through) a first sidewall 30, and a second subset of the plurality n of second connection elements 32 is arranged in (extends through) a second sidewall 30. In FIG. 5, the two sidewalls 30 are opposing sidewalls. This, however, is only an example. It is possible to arrange second connection elements 32 in one sidewall only, in three sidewalls, or in all four sidewalls. Generally, arranging second connection elements 32 in two opposing sidewalls is sufficient to provide for an acceptable stability of the arrangement. For some applications, arranging second connection elements 32 in only one sidewall may also be sufficient. The number of second connection elements 32 may depend on the number of electrical connections that are needed to electrically contact the semiconductor arrangement on the substrate 10. The number of first connection elements 50 may be equal to the number of second connection elements 32. It is, however, also possible that some of the first connection elements 50 and/or some of the second connection elements 32 are not connected. The arrangement of the first connection elements 50 on the substrate 10 generally corresponds to the arrangement of the second connection elements 32 in the sidewalls 30.

Figure 6A:
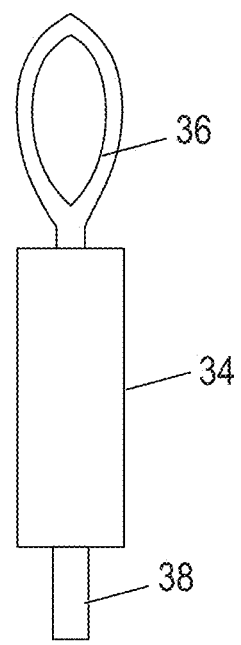
FIGS. 6A and 6B schematically illustrate exemplary connection elements.
Figure 6B:
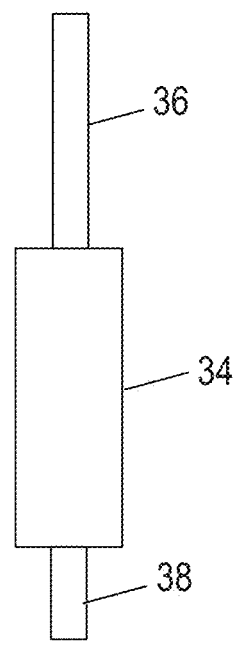

As is schematically illustrated in FIGS. 6A-B, each second connection element 32 comprises three parts. A first part 34, in the assembled state, extends through one of the sidewalls 30 of the housing (first parts 34 illustrated in dashed lines in FIG. 5). A second part 36 protrudes from the sidewall 30 in a vertical direction y. The second section 36 is coupled to a first end of the first part 34. A third part 38 is coupled to a second end of the first part 34 that is opposite to the first end, and protrudes from the sidewall 30 in the vertical direction y. While the second section 36 protrudes from an upper side of the sidewall 30, the third part 38 protrudes, e.g., from a lower side of the sidewall 30. FIGS. 6A and 6B schematically illustrate two different embodiments of the second part 36, namely a pressfit pin (FIG. 6A) and a simple pin or wire (FIG. 6B).

When mounting the sidewalls 30 to the substrate 10, the third parts 38 may be coupled to the first connection elements 50. For example, each of the first connection elements 50 may comprise a tubular part (such as, e.g., a sleeve or hollow bushing) that is configured to fit over and encircle or encompass a third part 38 of one of the second connection element 32. This means that a first end of each of the second connection elements 32 may be inserted into one of the first connection elements 50. In this way, a detachable mechanical and electrical connection may be provided between the substrate 10 and the first connection elements 50. The first connection elements 50 may be electrically and mechanically connected to the main substrate 10 by an electrically conductive connection layer (not illustrated). Such an electrically conductive connection layer may be a solder layer, a layer of an electrically conductive adhesive, or a layer of a sintered metal powder (e.g., a sintered silver powder), for example. These types of connection, however, are merely examples. The first connection elements 50 may also be mechanically and electrically connected to the substrate 10 in any other suitable way. The connection between the substrate 10 and the first connection elements 50 may be a non-detachable connection.

The first connection elements 50 may be arranged along the edges of the semiconductor substrate 10. The distribution of the first connection elements 50 on the substrate 10 matches the distribution of the second connection elements 32 in the sidewalls 30 such that at least some of the second elements 32 have a corresponding first connection element 50, wherein each first connection element 50 and each corresponding second connection element 32 are aligned with each other. Each first connection element 50 and each second connection element 32 has a certain tolerance due to the production process and due to the mounting processes of inserting the second connection element 32 into the sidewall 30 and of mounting the first connection element 50 onto the substrate 10. These tolerances, however, are generally unproblematic, as will be shortly discussed in the following.

FIG. 7A schematically illustrates a second connection element 32 comprising a second part 36 that includes a pressfit pin. The second connection element 32 in FIG. 7A is illustrated before having been mounted in the sidewall 30. The dashed lines in FIG. 7A, however, indicate the upper side and the lower side of the sidewall 30 in the assembled state. A reference plane A may be defined in a region where the first part 34 and the second part 36 of the second connection element 32 are connected to each other (region indicated in dashed lines in FIG. 7A). The third part 38 may have a certain deviation from this reference plane A, as can be seen in further detail in the detail illustrated in FIG. 7B. FIG. 7B illustrates the third part 38 in greater detail. An extension of the reference plane A is also indicated in FIG. 7B. The reference plane A may ideally divide the third part 38 in two equal parts. This case is indicated in solid lines in FIG. 7B. The width of both equal halves in this case is designated with d1 in FIG. 7B. Due to production tolerances it is, however, possible that the reference plane A will divide the third part 38 in two unequal halves. These cases are indicated in dotdashed (dotted or dashed) lines in FIG. 7B.

In these latter cases, the width d1' of one half may be less than the width d1 of equal halves, or the width d1" of one half may be greater than the width d1 of equal halves. When inserted in the sidewall 30, there may still be certain tolerances. Such tolerances, however, may differ from the tolerances in the non-mounted state illustrated in FIGS. 7A-B.

As is schematically illustrated in FIG. 8, the first metallization layer 111 that is arranged on the dielectric insulation layer 11 may also be subject to certain tolerances. For example, the edge region of the dielectric insulation layer 11 may not be covered by the first metallization layer 111, as is schematically illustrated in the top view of FIG. 8. A distance d2 between the edge of the first metallization layer 111 and the edge of the dielectric insulation layer 11 may vary to a certain degree (d2±x), similar to the width d1 (see FIG. 7B), due to manufacturing processes. Therefore, when arranging the first connection elements 50 on the substrate 10 (e.g., on the first metallization layer 111), the positions of the first connection elements 50 may also be subject to certain tolerances.

Even further, the first connection elements 50 themselves may be subject to certain tolerances. FIG. 9 schematically illustrates a cross-sectional view of a second connection element 50 comprising a tubular part 51. The tubular part 51 is open at a first end (upper end in FIG. 9) and at a second end opposite to the first end (lower end in FIG. 9). The tubular part 51 may comprise a collar 52 at each of its open ends. At least the tubular part 51 may be subject to certain tolerances with respect to a reference plane B. One reason for this is that a diameter d4 of the tubular part 51 may slightly vary for different first connection elements 50 (d4±y). Also, the reference plane B may divide the tubular part 51 either in two equal halves or in two unequal halves, resulting in a slightly varying width d3 of the halves (d3±z), similar to what was described with respect to FIG. 7B above. However, during the manufacturing of the individual parts as well as during the mounting process of the first connection element 50 onto the substrate 10 and of the second connection element 32 onto the sidewall 30, tolerances may be kept within an acceptable range such that it is still possible to connect the first connection elements 50 to the corresponding second connection elements 32.

Figure 10:
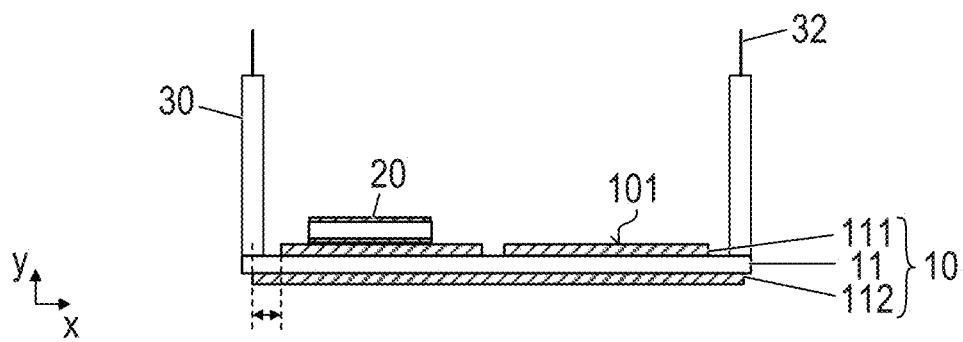
FIG. 10 is a cross-sectional view of an example of a power semiconductor module arrangement.
Figure 11:
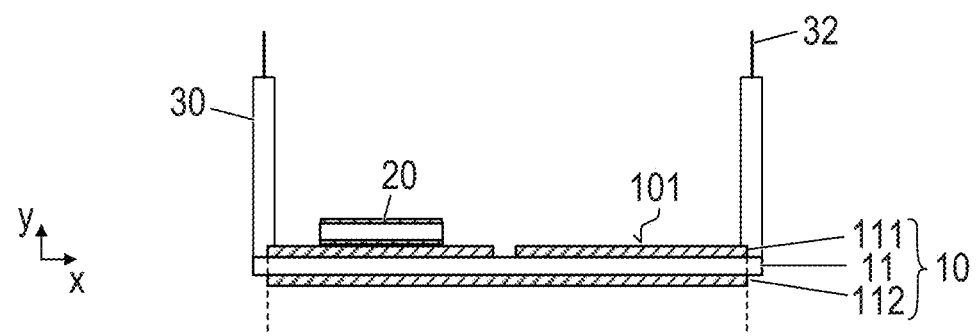
FIG. 11 is a cross-sectional view of another example of a power semiconductor module arrangement.

As was illustrated in FIGS. 1, 4 and 5 above, the first connection elements 50 may be coupled to the first metallization layer 111 such that the first metallization layer 111 is arranged between the first connection elements 50 and the dielectric insulation layer 11. The sidewalls 30, when mounted on the substrate 10, therefore are also in contact with the first metallization layer 111. This, however, is only an example. As is schematically illustrated in FIG. 10, the sidewalls 30, when mounted on the substrate 10, may only be in contact with the dielectric insulation layer 11. According to an even further example that is schematically illustrated in FIG. 11, the sidewalls 30 may be in contact with both the dielectric insulation layer 11 and the first metallization layer 111. In these last two cases, the first connection elements 50 may either be coupled to the first metallization layer 111 or to the dielectric insulation layer 11. The first connection elements 50 are not specifically illustrated in FIGS. 10 and 11.

As can be seen from the example illustrated in FIG. 11, the first and second metallization layer 111, 112 may be aligned with each other. In particular, the edges of the first and second metallization layers 111, 112 may be aligned with each other. This is indicated with the dashed lines in FIG. 11. In the example of FIG. 11, a distance between the edge of the first metallization layer 111 and the edge of the dielectric insulation layer 11 equals a distance between the edge of the second metallization layer 112 and the edge of the dielectric insulation layer 11. The sidewalls 30 in this example exert a certain pressure on edge regions of the first metallization layer 111. In this way, a deflection of the substrate 10, which may result from the alignment of the metallization layers 111, 112, may be prevented or at least reduced. In the example of FIG. 10, the first metallization layer 111 is not aligned with the second metallization layer 112. That is, a distance between the edge of the first metallization layer 111 and the edge of the dielectric insulation layer 11 is greater (or smaller) than a distance between the edge of the second metallization layer 112 and the edge of the dielectric insulation layer 11. A deflection of the substrate 10 in such cases is usually less than a deflection in the example of FIG. 11 (aligned metallization layers). Therefore, in some arrangements it is possible to arrange the sidewalls 30 such that they do not overlap with the first metallization layer 111.

Figure 12:
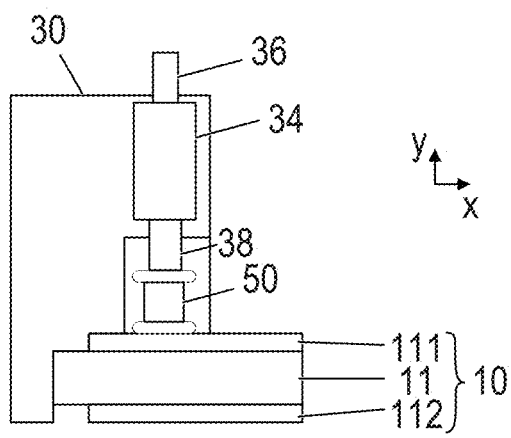
FIG. 12 is a cross-sectional view of a section of an exemplary power semiconductor module.

FIG. 12 schematically illustrates an exemplary arrangement wherein the sidewalls 30 are in contact with both the first metallization layer 111 and the dielectric insulation layer 11. The second connection element 32 in this example is a straight element, as has been described with respect to FIGS. 6A-B and 7A-B above. When the second connection element 32 is a straight element, this means that the second connection element 32 is essentially mirror symmetrical and may be divided in two essentially equal halves by an axis passing through the second connection element 32 in a vertical direction y. The sidewall 30 may comprise recesses or cavities, wherein, when the sidewalls 30 are mounted on the substrate 10, the first connection elements 50 are arranged within the recesses or cavities.

Figure 13:
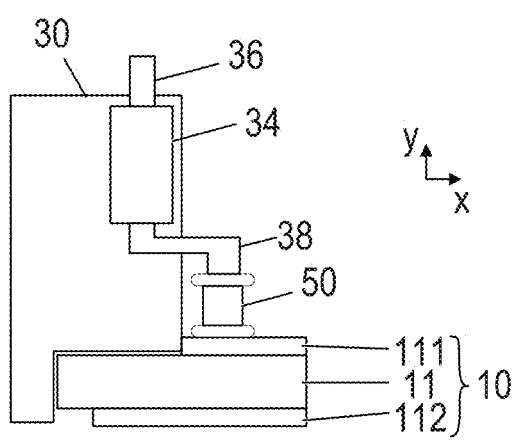
FIG. 13 is a cross-sectional view of a section of another exemplary power semiconductor module.

According to another example that is schematically illustrated in FIG. 13, the at least one second connection element 32 may be a bent element. While, in the example of FIG. 12, the third part 38 protrudes from the sidewall 30 at its lower end, the third part 38 in FIG. 13 protrudes from the sidewall 30 in a horizontal direction x. The third part 38 may be coupled to the first part 34 at a lower end of the first part 34. The third part 38 may comprise at least a first portion and a second portion, wherein the first portion protrudes from the respective sidewall 30 in the horizontal direction x that is perpendicular to the vertical direction y. The second portion may extend perpendicular to the first portion in the vertical direction y, wherein the second portion of the third part 38, when the sidewall 30 is mounted on the substrate 10, is detachably coupled to one of the at least one first connection elements 50. In the example of FIG. 13, the first connection element 50, when coupled to the second connection element 32, is arranged beside the sidewall 30 in the horizontal direction x instead of below the sidewall 30 or within a recess or cavity of the sidewall 30 (see, e.g., FIG. 12). The embodiments of FIGS. 12 and 13, however, are merely examples. Any other suitable geometries and shapes of the second connection element 32 are also possible.

If the sidewalls 30 in the mounted state are arranged such that they are in contact with the dielectric insulation layer 11, it is, e.g., possible to form a welded joint between the sidewalls 30 and the dielectric insulation layer 11. For example, the dielectric insulation layer 11 and the sidewalls 30 may comprise a plastic material. The plastic parts may then be welded by means of plastic welding, for example, to form the welded joint. By forming a welded joint between the dielectric insulation layer 11 and the sidewalls 30, the gas-tightness of the power semiconductor module arrangement may be increased such that less gas may penetrate into the inside of the housing when the housing is completely closed (sidewalls mounted on substrate and lid mounted on sidewalls).

When the second connection element 32, in particular the third part 38 of the second connection element 32, is inserted into the first connection element 50, the first connection element 50 and the second connection element 32 may form a pressfit connection, for example.

Figure 14:
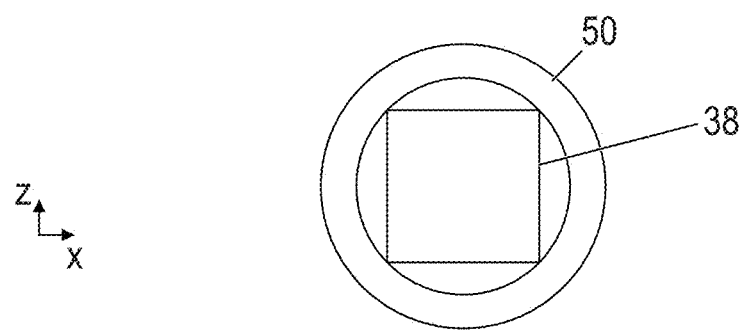
FIG. 14 illustrates exemplary cross-sections of the connection elements.

FIG. 14 schematically illustrates possible cross sections of the first and second connection elements 32, 50. For example, when seen from above, the first connection element 50 may have a rounded or oval cross-section. The third part 38 of the second connection element 32 may have a square or rectangular cross-section, for example. When inserting a square third part into a round first connection element 50, the third part 38 may tightly fit into the first connection element 50 and form a stable mechanical connection which is not easily detachable. The cross-sections illustrated in FIG. 14, however, are only examples. Any other suitable cross-sections are also possible. The third part 38 may also have a shape similar to the second part that is illustrated in FIG. 6A, for example.

Figure 15:
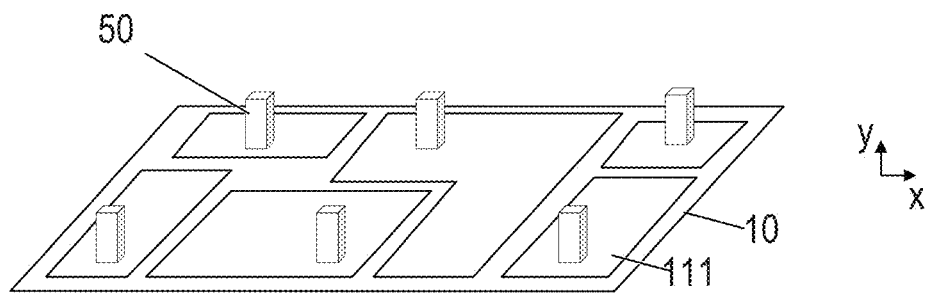
FIG. 15 schematically illustrates a semiconductor substrate according to another embodiment.
Figure 16:
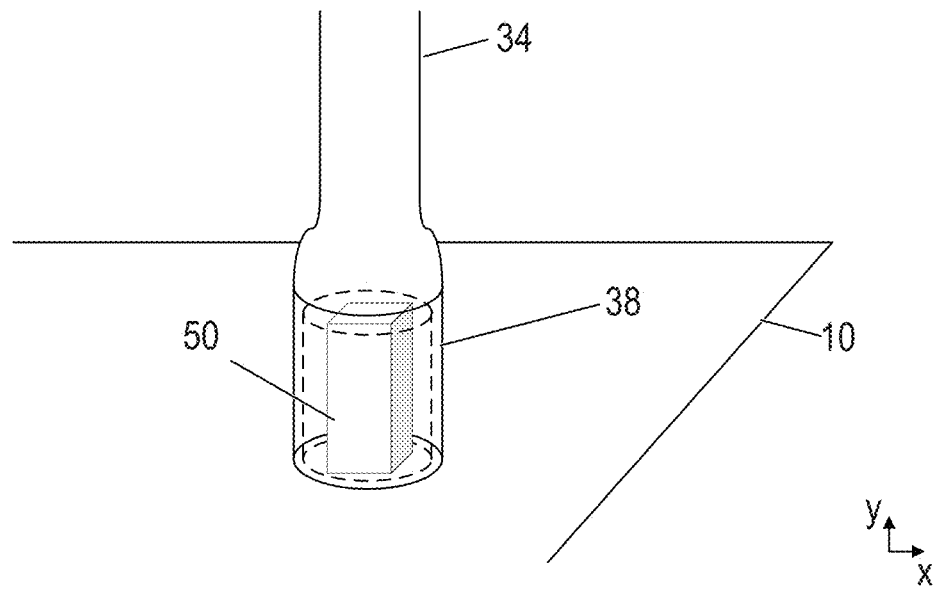
FIG. 16 schematically illustrates a section of a semiconductor substrate with an exemplary connection element.

Now referring to FIGS. 15 and 16, it is also possible to interchange the shapes of the first and the second connection elements 32, 50. That is, for example, each of the third parts 38 of the second connection elements 32 may comprise a tubular part (such as, e.g., a sleeve or hollow bushing) that is configured to fit over and encircle or encompass one of the first connection elements 50. This means that each of the first connection elements 50 may be implemented as a wire, a pin, or pressfit pin, for example, that may be inserted into the third part 38 of one of the second connection elements 32. This is another suitable way to provide a detachable mechanical and electrical connection between the substrate 10 and the first connection elements 50.

FIG. 15 exemplarily illustrates a semiconductor substrate 10 comprising a structured first metallization layer 111. Each of the first connection elements 50 is arranged on a different section of the first metallization layer 111. This, however, is only an example. It is also possible to arrange two or more first connection elements 50 on the same section of the first metallization layer 111.

FIG. 16 schematically illustrates a first connection element 50 that comprises a wire, a pin, or pressfit pin, and a second connection element 32 that comprises a third part 38 comprising a tubular part (such as, e.g., a sleeve or hollow bushing) that is configured to fit over and encircle or encompass the first connection element 50. In FIG. 16, only a section of a semiconductor substrate 10 is illustrated. The second part 36 of the second connection element 32 is not specifically illustrated in FIG. 16. For the sake of simplicity, the first metallization layer 111 is not specifically illustrated in FIG. 16.

In FIG. 16, the second connection element 32 is illustrated without the respective sidewall 30 of a housing. As has been described above, the third part 38 of the second connection element 32 may protrude from the sidewall 30. However, it is also possible that the third part 38 of the second connection element 32 be molded into the sidewall 30. In this way, when inserting the first connection element 50 into the third part 38, no gap is formed between the sidewalls 30 and the substrate 10. If the third parts 38 protrude from the sidewall 30, a gap may remain between the sidewalls 30 and the substrate 10 after inserting the first connection elements 50 into the third parts 38. Such a gap may be closed by inserting a suitable material between the sidewalls 30 and the substrate 10, for example.

In the examples illustrated in FIGS. 15 and 16, the cross-sections of the first connection elements 50 and the third parts 38 of the second connection elements 32 may be interchanged. For example, when seen from above, the first connection element 50 may have a square or rectangular cross-section. The third part 38 of the second connection element 32, on the other hand, may have a rounded or oval cross-section, for example. When inserting a square first connection element 50 into a round third part 38, the first connection element 50 may tightly fit into the third part 38 and form a stable mechanical connection which is not easily detachable. Such cross-sections, however, are only examples. Any other suitable cross-sections are also possible. The first connection element 50 may also have a shape similar to the second part that is illustrated in FIG. 6A, for example.

In the Figures, the semiconductor substrate 10 has been described as a substrate comprising a single dielectric insulation layer 11. This, however, is only an example. The substrate 10 may also be a multi-layer substrate. A multi-layer substrate, in addition to the first dielectric insulation layer 11, further comprises at least one additional dielectric insulation layer. The first metallization layer 111 may then be arranged between the first dielectric insulation layer 11 and an additional dielectric insulation layer. A third metallization layer may be formed on a top surface of the additional dielectric insulation layer. The first metallization layer 111 and the third metallization layer may be connected by means of vias which extend through the additional dielectric insulation layer. When using a multi-layer substrate, the semiconductor bodies 20 may be arranged on the third metallization layer, for example. According to another example, the multi-layer substrate may comprise more than one additional dielectric insulation layer, with additional metallization layers arranged between the different dielectric insulation layers.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A power semiconductor module arrangement, comprising:
- a substrate comprising a dielectric insulation layer, a first metallization layer arranged on a first side of the dielectric insulation layer, and a second metallization layer arranged on a second side of the dielectric insulation layer, the dielectric insulation layer being disposed between the first metallization layer and the second metallization layer;
- at least one first connection element mounted on the substrate;
- a housing comprising sidewalls; and
- at least one second connection element, each second connection element comprising a first part extending vertically through a sidewall of the housing, a second part coupled to a first end of the first part and protruding from the sidewall in a vertical direction, and a third part coupled to a second end of the first part opposite the first end,
- wherein each third part is detachably coupled to one of the at least one first connection element.

2. The power semiconductor module arrangement of claim 1, wherein each of the third parts protrudes from the sidewall of the housing, wherein each of the at least one first connection element comprises a tubular part configured to fit over and encircle a third part of one of the second connection elements, and wherein each of the third parts is inserted into one of the at least one first connection element such that each first connection element encircles the respective one of the third parts.

3. The power semiconductor module arrangement of claim 2, wherein each of the third parts forms a pressfit connection with one of the at least one first connection element when detachably connected to the respective first connection element.

4. The power semiconductor module arrangement of claim 1, wherein the third part of each of the at least one second connection element comprises a tubular part configured to fit over and encircle one of the at least one first connection element, and wherein each of the at least one first connection element is inserted into one of the third parts of the at least one second connection element such that each third part encircles the respective one of the first connection element.

5. The power semiconductor module arrangement of claim 4, wherein each of the third parts forms a pressfit connection with one of the at least one first connection element when detachably connected to the respective first connection element.

6. The power semiconductor module arrangement of claim 1, wherein each of the at least one first connection element has a round or oval cross section and each of the third parts has a square or rectangular cross section.

7. The power semiconductor module arrangement of claim 1, wherein each of the at least one first connection element has a square or rectangular cross section and each of the third parts has a round or oval cross section.

8. The power semiconductor module arrangement of claim 1, wherein each first part of the at least one second connection element is molded into one of the sidewalls of the housing.

9. The power semiconductor module arrangement of claim 1, wherein each second part comprises a wire, a pin or a pressfit pin.

10. The power semiconductor module arrangement of claim 1, wherein for each second connection element, the third part protrudes from a respective sidewall of the housing in the vertical direction, the second part protrudes from a first end of the sidewall, and the third part protrudes from a second end of the sidewall opposite the first end.

11. The power semiconductor module arrangement of claim 1, wherein for each second connection element, the third part comprises a first portion protruding from a respective sidewall of the housing in a horizontal direction that is perpendicular to the vertical direction, and a second portion outside the sidewall extending perpendicular to the first portion in the vertical direction, and wherein the second portion is detachably coupled to one of the at least one first connection element.

12. The power semiconductor module arrangement of claim 1, wherein the at least one first connection element is mounted on the first metallization layer.

13. The power semiconductor module arrangement of claim 1, wherein the power semiconductor module arrangement comprises a plurality of the second connection elements, wherein a first subset of the plurality of second connection elements extends through a first sidewall of the housing, and wherein a second subset of the plurality of second connection elements extends through a second sidewall of the housing opposite the first sidewall.

14. The power semiconductor module arrangement of claim 1, wherein the dielectric insulation layer comprises a plastic material, wherein the sidewalls of the housing comprise a plastic material, and wherein a welded joint is formed between the dielectric insulation layer and the sidewalls.

15. A housing for a power semiconductor module arrangement, the housing comprising:
- sidewalls; and
- at least one second connection element, each second connection element comprising a first part extending vertically through a sidewall of the housing, a second part coupled to a first end of the first part and protruding from the sidewall in a vertical direction, and a third part coupled to a second end of the first part opposite the first end,
- wherein the housing is configured to be detachably mounted onto a substrate by detachably coupling each of the third parts to a first connection element mounted on the substrate, the substrate comprising a dielectric insulation layer, a first metallization layer arranged on a first side of the dielectric insulation layer, a second metallization layer arranged on a second side of the dielectric insulation layer, wherein the dielectric insulation layer is disposed between the first and the second metallization layer.

16. The housing of claim 15, wherein each third part of the at least one second connection element has a square or rectangular cross section, or a round or oval cross section.

17. The housing of claim 15, wherein each first part of the at least one second connection element is molded into one of the sidewalls of the housing.

18. The housing of claim 15, wherein each second part of the at least one second connection element comprises a wire, a pin or a pressfit pin.

19. The housing of claim 15, wherein for each second connection element, the third part protrudes from a respective sidewall of the housing in the vertical direction, the second part protrudes from a first end of the sidewall, and the third part protrudes from a second end of the sidewall opposite the first end.

20. The housing of claim 15, wherein for each second connection element, the third part comprises a first portion protruding from a respective sidewall of the housing in a horizontal direction that is perpendicular to the vertical direction, and a second portion outside the sidewall extending perpendicular to the first portion in the vertical direction.

\* \* \* \* \*